United States Patent
Taguchi et al.

[11] Patent Number: 5,169,799
[45] Date of Patent: * Dec. 8, 1992

[54] METHOD FOR FORMING A DOPED ZNSE SINGLE CRYSTAL

[75] Inventors: Tsunemasa Taguchi, Suita; Hirokuni Nanba, Osaka, both of Japan

[73] Assignees: Sumitomo Electric Industries, Ltd.; Production Engineering Association, both of Osaka, Japan

[*] Notice: The portion of the term of this patent subsequent to Sep. 12, 2006 has been disclaimed.

[21] Appl. No.: 684,508

[22] Filed: Apr. 15, 1991

Related U.S. Application Data

[63] Continuation of Ser. No. 323,900, Mar. 15, 1989, abandoned.

[30] Foreign Application Priority Data

Mar. 16, 1988 [JP] Japan ................................. 63-62368

[51] Int. Cl.$^5$ ............................................. H01L 21/20
[52] U.S. Cl. ................................ 437/108; 437/167; 437/247; 437/165; 156/603; 156/606; 156/DIG. 72; 156/DIG. 77
[58] Field of Search ................. 252/62.3 ZT; 148/33; 156/603, 606, 604, DIG. 72, DIG. 77, 620.76, 620.7; 437/108, 141, 165, 167

[56] References Cited

U.S. PATENT DOCUMENTS

| | | | |
|---|---|---|---|
| 3,326,730 | 6/1967 | Mandel | 437/165 |
| 3,385,656 | 5/1968 | Aven . | |
| 3,544,468 | 12/1970 | Catano | 252/62.3 ZT |
| 3,745,073 | 7/1973 | Kun | 437/167 |
| 4,244,753 | 1/1981 | Harnack . | |
| 4,422,888 | 12/1983 | Stutius | 156/606 |
| 4,526,632 | 7/1985 | Nishizawa | 437/167 |
| 4,783,426 | 11/1988 | Nishizawa | 437/167 |
| 4,866,007 | 9/1989 | Taguchi | 437/247 |

FOREIGN PATENT DOCUMENTS

| | | |
|---|---|---|
| 282998 | 9/1988 | European Pat. Off. . |
| 2046036 | 4/1971 | Fed. Rep. of Germany . |
| 3123234 | 6/1982 | Fed. Rep. of Germany . |

OTHER PUBLICATIONS

S. Wolf and R. N. Tauber, Silicon Processing for the VLSI Era vol. 1: Process Technology, pp. 242–245, section on the "Mathematics of Diffusion" Lattice Press, Sunset Beach, Calif. (1986).

Patent Abstracts of Japan, "N-Form Diffusion Method of ZnSe", Apr. 25, 1987, Patent 270300.

*Primary Examiner*—Brian E. Hearn
*Assistant Examiner*—Linda J. Fleck
*Attorney, Agent, or Firm*—Cushman, Darby & Cushman

[57] ABSTRACT

A method of forming a ZnSe single crystal. The method includes placing a piece of ZnSe polycrystal in a sealed reactor tube with its atmosphere formed of certain gases. The reactor tube is moved through different temperature zones to convert the polycrystal to a single crystal. The single crystal thus formed is cut to produce a single crystal chip or wafer. An impurity is then implanted in the chip or wafer. Lastly the chip or wafer is heated to diffuse the impurity throughout the chip or wafer.

1 Claim, 4 Drawing Sheets

METHOD FOR FORMING A DOPED ZNSE SINGLE CRYSTAL

This is a continuation of application Ser. No. 07/323,900, filed on Mar. 15, 1989, which was abandoned upon the filing hereof.

BACKGROUND OF THE INVENTION

Field of the Invention

The present invention relates to a semiconductive crystal containing n-type or p-type impurities. More particularly, the present invention relates to a semiconductive ZnSe single crystal to which n-type or p-type impurities are selectively doped and which is used in photoelectronic devices.

ZnSe is one of the II/VI group compound semiconductors and has the direct transition type band gap ($E_g$) of as large as 2.7 eV. Therefore, ZnSe is a highly promising material of blue light emitting diode.

However, the blue light emitting diode has not been made from ZnSe, because no p-n junction can be formed and no good bulk substrate is produced.

Although the present invention does not relate to a method for producing the bulk single crystal, the present status of the bulk single crystal will be first explained since the nature of the bulk single crystal has large influence on the impurity doping.

The reason why it is difficult to produce the bulk single crystal of ZnSe is that ZnSe is easily sublimated and cannot be melted by simply heating it under atmospheric pressure so that it is difficult to grow the single crystal from a ZnSe melt.

Hitherto, several methods such as a high pressure melting method, an iodine transporting method, a solution growth method and a sublimation method have been proposed to grow the ZnSe single crystal. The first two methods can produce a comparatively large single crystal with good reproducibility, although the single crystal contains a large amount of impurities and many defects such as stacking faults and twin crystals. The last two methods cannot produce any large size single crystal. In addition, none of these methods can produce a single crystal having satisfactory sizes and characteristics.

The ZnSe single crystal produced by these method is a non-doped type one, but the single crystal as grown has a considerably high resistivity of about $10^8$ ohm.cm in the form of an n-type.

When such single crystal is used as a substrate of a light emitting diode (LED), one of electrodes is attached to one surface of the substrate and an exciting current flows through the substrate. Therefore, the substrate should not have high resistance. If the substrate had high resistance, a sufficient amount of electric current could not flow through the p-n junction.

To decrease the resistivity of the ZnSe single crystal, it is contemplated to dope an n-type or p-type impurity to the single crystal to make an n-type or p-type semiconductor. However, the amount of a dopant cannot be regulated in the ZnSe single crystal, while it is possible to regulate the amount of the dopant in the Si and GaAs single crystals. Reproducibility of the doping of ZnSe single crystal is not good. In addition, it has been believed that any p-type ZnSe single crystal could be produced.

To decrease the resistance of the ZnSe single crystal, proposed is a method comprising adding a ZnSe single crystal in a zinc melt or a zinc melt containing a suitable impurity and heating the melt at a temperature around 1,000° C. This process intends to decrease the resistivity of the ZnSe single crystal from $10^8$ ohm.cm to $10^1$ ohm.cm by doping the n-type impurity. In this method, the impurity is diffused in the ZnSe single crystal in a thermal equilibrium state.

By the thermal equilibrium doping, the doping amount can be well controlled with good reproducibility in cases of Si and GaAs. That is, in cases of Si and GaAs, the concentration of the doped impurity and the resistivity can be freely adjusted.

However, in case of the ZnSe single crystal, the impurity is not adequately doped, so that the doped amount of the impurity cannot be determined by the concentration of the impurity in the zinc melt. This is because the ZnSe single crystal contains a large number of vacant lattices and impurities. Then, the impurity to be doped is not necessarily positioned at an intended site, and the originally present vacant lattices and/or impurities may be moved by the thermal treatment.

The p-type doping of the ZnSe single crystal is more difficult than the n-type doping of the ZnSe single crystal described above. Recently, the growth of the p-type ZnSe bulk single crystal through Li-doping by the vapor pressure controlling method was reported by J. Nishizawa et al., "Blue Light Emission from ZnSe p-n junction", J. Appl. Phys., 57 (6), 2210–2216 (1985). But the reported method has doubtful reproducibility.

Since the thermal equilibrium doping achieves unsatisfactory effects, many methods for ion implantation of impurities into the ZnSe single crystal have been proposed. The ion implantation is a non-equilibrium doping. Since the ions of impurity are forced to be implanted, the impurity ions can reach to any depth of the single crystal.

The ion implantation is one of successful doping methods in cases of Si and GaAs, and advantageously applied to a wide variety of ions. However, since the ion implantation causes distortion of the lattices, the ion implanted single crystals should be annealed. The ZnSe single crystal should be also annealed after ion implantation. However, since the impurities and/or the vacant lattices would be moved, the predetermined doping level is not achieved. That is, the doping of ZnSe single crystal cannot be controlled.

As explained above, by the thermal equilibrium doping, the kind and amount of the impurities cannot freely controlled. This can be attributed to the nature of the non-doped single crystal. The as grown ZnSe single crystal produced by the high pressure melting method or the iodine transporting method inherently contains a large amount of the impurities, and the state of the impurities are not stable in the crystal so that it may vary at high temperatures. If the ZnSe single crystal inherently containing the large amount of the impurities is thermally treated in the Zn melt for a long time, such impurities are activated. Although the impurities contained in the Zn melt diffuse into the single crystal, they will not occupy the intended lattice sites because of the presence of turbulence of the lattice structure.

Consequently, none of the known methods for doping the impurities in the single crystal can dope the ZnSe single crystal which is produced by the conventional methods with the impurity while freely selecting the kind and the amount of the impurity.

SUMMARY OF THE INVENTION

One object of the present invention is to provide a ZnSe single crystal which contains an n-type or p-type impurity in a predetermined amount.

Another object of the present invention is to provide a method for producing a ZnSe single crystal containing an n-type or p-type impurity in a predetermined amount.

Accordingly, the present invention provides a ZnSe single crystal which is obtainable by a method comprising steps of:

placing a piece of a ZnSe polycrystal in a sealed reactor tube having an atmosphere of at least one gas selected from the group consisting of an inert gas, nitrogen and $H_2Se$ kept at pressure of from 0.1 Torr. to 100 Torr., moving the reactor tube containing the piece of ZnSe polycrystal through a low temperature first zone kept at a temperature of from room temperature to 100° C., a temperature-raising second zone having a temperature gradient of from 50° C./cm to 200° C./cm, a high temperature third zone kept at a temperature of from 700° C. to 900° C., a temperature-lowering fourth zone having a temperature gradient of from $-200°$ C./cm to $-50°$ C./cm and a low temperature fifth zone kept at a temperature of from room temperature to 100° C. in this order at a moving rate of from 0.05 mm/day to 5 mm/day while keeping the solid state of the ZnSe crystal whereby the ZnSe polycrystal is converted to a ZnSe single crystal, cutting the ZnSe single crystal to form a ZnSe single crystal chip or wafer, placing the ZnSe single crystal chip or wafer in a reactor containing, in case of doping an n-type impurity, zinc and the n-type impurity or a compound comprising the n-type impurity and zinc or, in case of doping a p-type impurity, selenium and the p-type impurity or a compound comprising the p-type impurity and selenium and heating the reactor at a temperature of 400° C. to 900° C. under pressure of 1 Torr. to 100 Torr. for at least 20 hours to diffuse the impurity atoms in the ZnSe single crystal.

DETAILED DESCRIPTION OF THE DRAWINGS

In the present invention, the ZnSe single crystal is produced by the method disclosed in Japanese Patent Kokai Publication No. 230599/1988 (Application No. 65389/1987), which is based on the novel technique very different from the conventional methods such as the high pressure melting method, the iodine transporting method, the sublimation method and the like.

Figure 2:
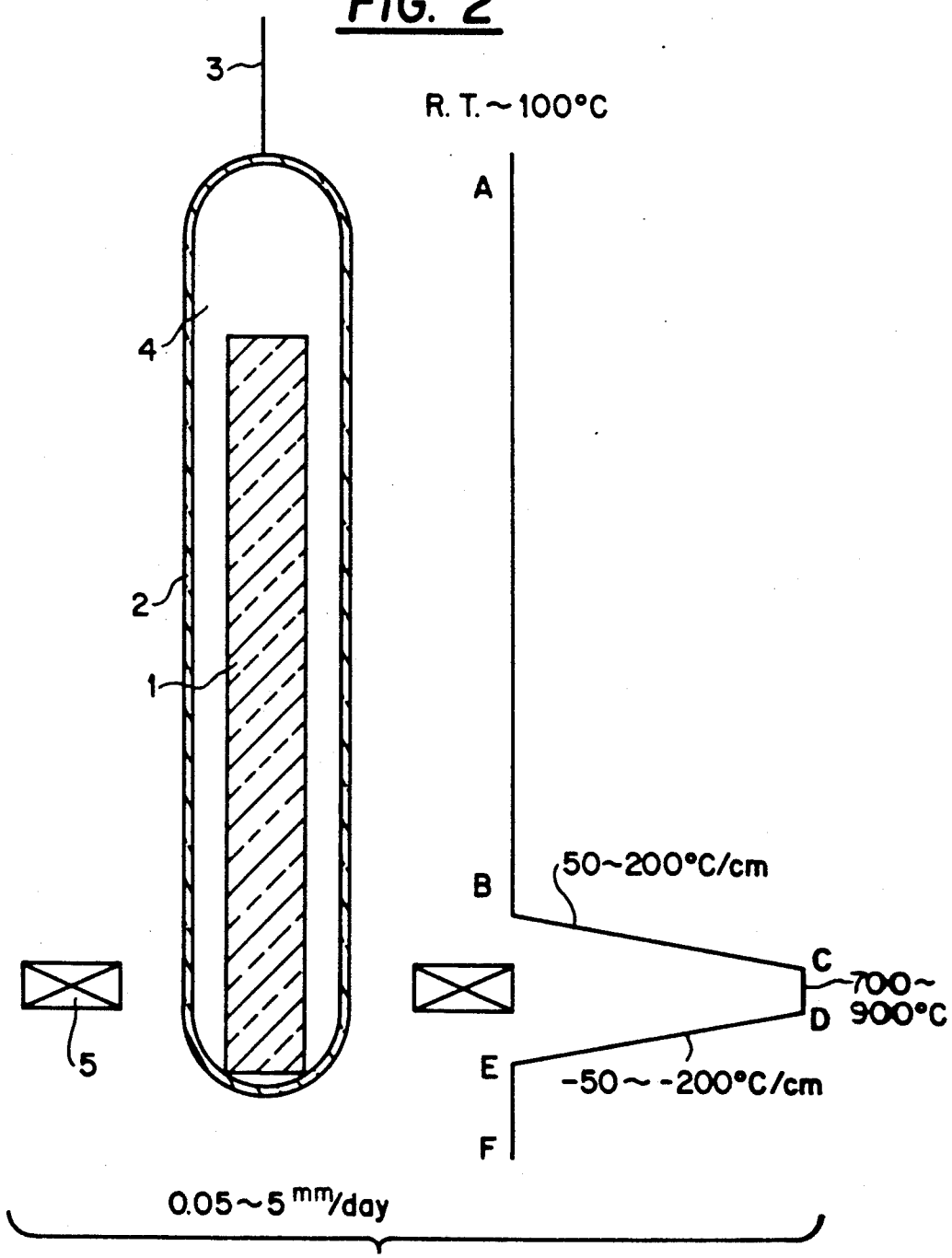

This method for producing the ZnSe single crystal will be illustrated by making reference to FIG. 2.

The ZnSe polycrystal having a suitable size can be produced by the conventional CVD or sintering method. From the polycrystal bulk, a rod is cut out to partially heat the polycrystal in the subsequent steps. For example the rod has a diameter of from 3 to 30 mm.

The polycrystal rod 1 is placed in a reaction tube 2, for example, a quartz capsule. Then, the tube is filled with at least one gas 4 selected from the group consisting of an inert gas, nitrogen and $H_2Se$, and sealed. The amount of the gas is so adjusted that the inner pressure reaches 0.1 Torr. to 100 Torr. during heating. The capsule may not be sealed if the subsequent heating is carried out in the atmosphere of the above described gas.

Then, the reactor tube 2 is suspended by a lifting means 3 and heated with a heater 5. The temperature profile to be achieved by the heater 5 is schematically shown in FIG. 2 by the line A-B-C-D-E-F, although the actual temperature distribution may not be such simple shape.

A low temperature first zone corresponding to the line A-B is kept at a temperature of from room temperature to 100° C. A temperature-raising second zone corresponding to the line B-C has a temperature gradient of from 50° C./cm to 200° C./cm. A high temperature third zone corresponding to the line C-D is kept at a temperature of from 70020 C. to 900° C. The length of the third zone (C-D) is made as short as possible, for example 5 mm to 20 mm. A temperature-lowering fourth zone corresponding to the line D-E has a temperature gradient of from $-200°$ C./cm to $-50°$ C./cm. Finally, a low temperature fifth zone corresponding to the line E-F is kept at a temperature of from room temperature to 100° C. The reactor tube 5 is passed from the first zone to the fifth zone at a rate of from 0.05 mm/day to 5 mm/day while keeping the solid state of the ZnSe material. Since only the zone C-D is kept at the high temperature, the ZnSe polycrystal is converted to a ZnSe single crystal. Since temperature is not higher than 900° C. even in the high temperature third zone and the atmosphere is filled with the above gas, ZnSe is not sublimated and keeps the solid state. In FIG. 2, the zones are vertically arranged, although they may be horizontally or slantwise arranged.

Since the crystal is moved relatively to the heater, this method is a kind of the traveling heater methods. Since the polycrystal is converted to the single crystal through rotation of crystalline grains, this method is in the category of recrystallization. Then, the above method for converting the polycrystal to the single crystal can be named as "Recrystallization Traveling Heater Method" (RTHM).

The ZnSe single crystal produced by the above new method contains little residual impurities and a very high resistance. That is, such ZnSe single crystal is very highly pure and very close to the intrinsic semiconductor. Such the pure ZnSe single crystal can be doped by the thermal equilibrium doping. That is, the kind and the amount of the impurity can be controlled.

Figure 1:
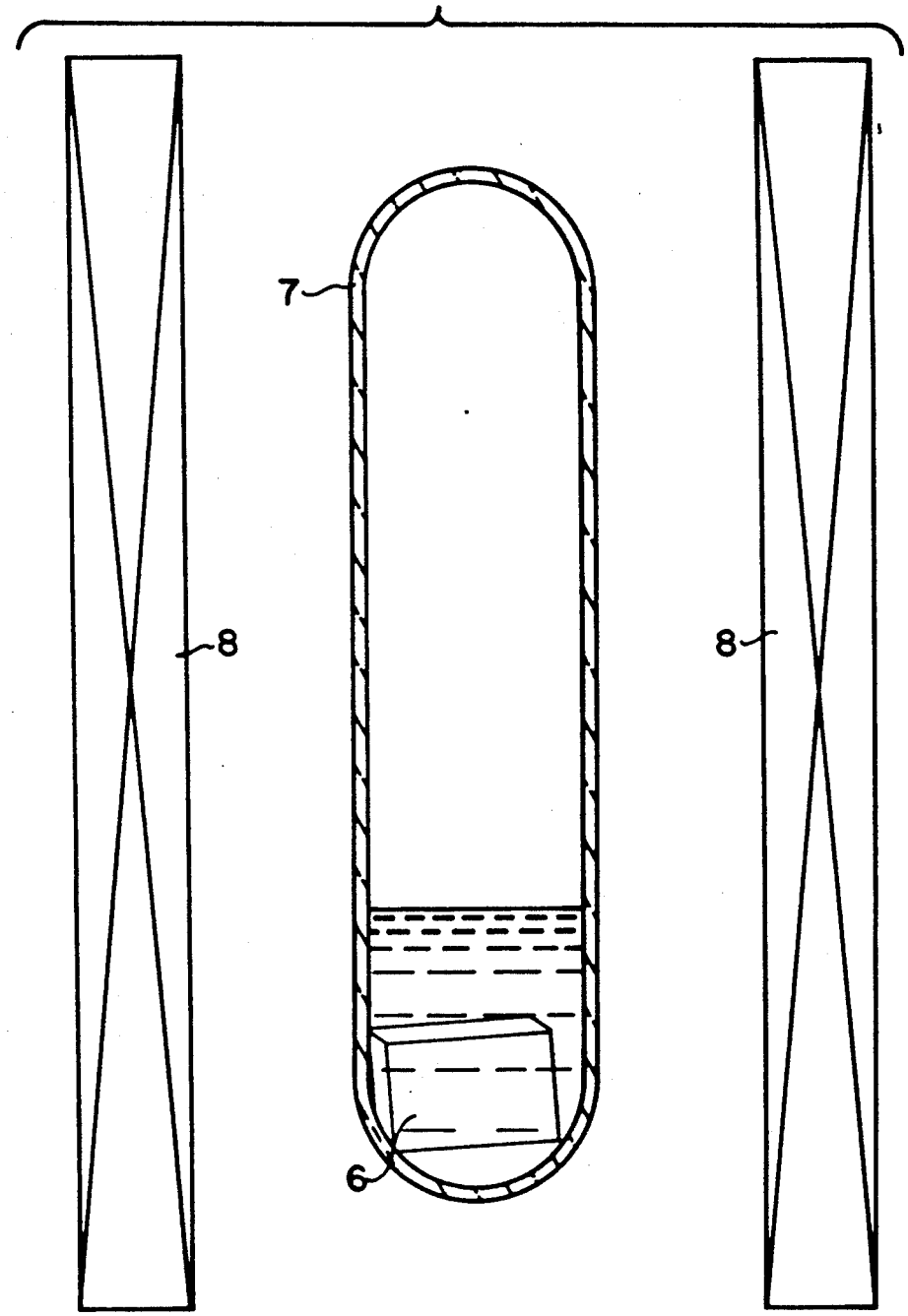
FIG. 1 schematically shows the method for doping the ZnSe single crystal according to the present invention, FIG. 2 schematically shows the RTHM (Recrystallization Traveling Heater Method) for producing the ZnSe single crystal from the ZnSe polycrystal.

The method of the present invention for doping the ZnSe single crystal with the impurity will be explained. FIG. 1 schematically shows such doping method.

(1) From the ZnSe single crystal rod, a chip or a wafer 6 is cut out. The plane direction of the cut out chip or wafer is arbitrary.

(2) The chip or wafer 6 of the ZnSe single crystal is placed in a reactor 7 such as a quartz ampoule.

(3) In case of doping of the n-type impurity, a combination of highly pure (6 N 99.9999% or higher) zinc and the donor impurity is used. Examples of the donor impurity are metal elements such as Al, Ga and In and non-metallic elements such as Cl, I and F. The metal element is used in the form of a solid material in the quartz reactor. The non-metallic element may be used as a compound with zinc such as $ZnCl_2$, $ZnI_2$ and $ZnF_2$. These compounds should be highly pure, for example have a purity of 5 N or higher. Alternatively, $I_2$, $Cl_2$ or $Fe_2$ gas may be used.

Zinc is used together with the impurity material by the following reason:

Since zinc easily liberates an electron, such electron is easily discharged in the crystal when the zinc atom is present at the lattice point. However, if the zinc atom is not present at the lattice point, the number of electrons is insufficient in the crystal, so that the vacant lattice tends to attract the electrons from surrounding lattices. Thus, the vacant lattice in the ZnSe single crystal acts as an acceptor.

Since many acceptors are formed if a large number of the vacant lattices are generated in the ZnSe single lattice, the doped impurity atoms are compensated with such acceptors so that the doped impurities do not provide the n-type carrier in the desired concentration.

Then, to prevent such formation of the vacant lattices in the ZnSe single crystal, zinc is added.

(4) In case of doping of the p-type impurity, a combination of highly pure (purity of 6 N or higher) selenium and the donor impurity is used. Examples of the donor impurity are metal elements such as Na, K and Li and non-metallic elements such as P, As and N. The metal element is used in the form of a solid material in the quartz reactor. The non-metallic element may be used as a compound with selenium such as $Na_2Se$, $K_2Se$ and $Li_2Se$. These compounds have high melting points higher than 900° C., but can be soluble in selenium present in the reactor. The Li, Na or K atom will replace the zinc atom to form the acceptor.

P, As and N may be used in the form of $Zn_3P_2$, $Zn_3As_2$ and $Zn_3N_2$, respectively. Although P and As are solid at room temperature, they are vaporized at high temperature and can be used in the form of a gas. Each of these elements replace the selenium atom to form the acceptor.

(5) The reactor 7 is evacuated or evacuated and filled with an inert gas such as argon or a nitrogen gas. Then, the reactor is sealed.

Although the sealing of the reactor is easy, the reactor is used in the unsealed state while flowing the gas in the reaction atmosphere.

(6) The reactor is heated to a temperature of 400° C. to 900° C. and kept at such high temperature for 20 to 100 hours or longer. The reaction pressure is from about 1 Torr. to 100 Torr. Such pressure is generated through the evaporation of zinc or selenium when the reactor is used in the evacuated state. To increase the reaction pressure to higher pressure, the inert gas such as argon or the nitrogen gas is filled in the reactor.

In the method of the present invention, the ZnSe single crystal is kept in the zinc or selenium melt containing the impurity at high temperature for a long time, the impurity gradually diffuses from the surface to the inner part of the ZnSe single crystal so that the impurity atoms replace the lattice points of zinc or selenium to form the n- or p-type impurity.

When the element in the Group III of the Periodic Table such as Al, Ga or In is used as the n-type impurity, the zinc lattice point is replaced with the impurity element to form the donor level. When the element in the Group V of the Periodic Table such as P, As or N is used as the p-type impurity, the selenium lattice is replaced with the impurity element to form the acceptor impurity.

Since the highly pure ZnSe single crystal with less defects is used as the starting material in the method of the present invention, the desired type impurity can be doped in the crystal.

Since the zinc melt or vapor is present in the reaction system, the generation of the zinc vacant lattices is suppressed. Therefore, the zinc vacant lattices do not cause compensation as the acceptors.

In case of the p-type impurities, Li, K or Na thermally diffuses in the ZnSe single crystal and occupies the zinc lattices or the selenium lattices to form the acceptors. Since selenium is present in the reaction system, the generation of the selenium vacant lattices is suppressed.

The impurities penetrate into the ZnSe single crystal through the thermal diffusion. When the ZnSe single crystal is highly pure and contains little undesirable impurities, and the doping material and zinc or selenium are also highly pure, only the intended impurity is selectively doped in the ZnSe single crystal.

Since the method of the present invention utilizes the thermal diffusion to dope the impurity and the substrate having a large thickness, it takes long time. When the size of the chip or the wafer is large, for example, 1 mm in thickness the ZnSe single crystal substrate should be heated at least 20 hours.

The diffusion coefficient varies with the kind of the impurity and the reaction temperature. To achieve the desired concentration of the carrier, namely the electron concentration or the hole concentration in the ZnSe single crystal, the impurity concentration in the zinc or selenium melt, the reaction temperature and the reaction time are adjusted according to the kind of the impurity to be doped.

It is advantageous to adjust the vapor pressure of the impurity by providing the solid impurity material in some part of the reactor and controlling the temperature of said part to keep the solid state of the impurity.

Different from the ion implantation, since the impurity is thermally diffused gradually, the very thick ZnSe single crystal substrate can be doped by expanding the reaction time. For example, the ZnSe substrate having a thickness of 1 mm can be homogeneously doped.

PREFERRED EMBODIMENTS OF THE INVENTION

EXAMPLE 1

By the RTHM method, a rod of the ZnSe single crystal was produced.

Figure 3:
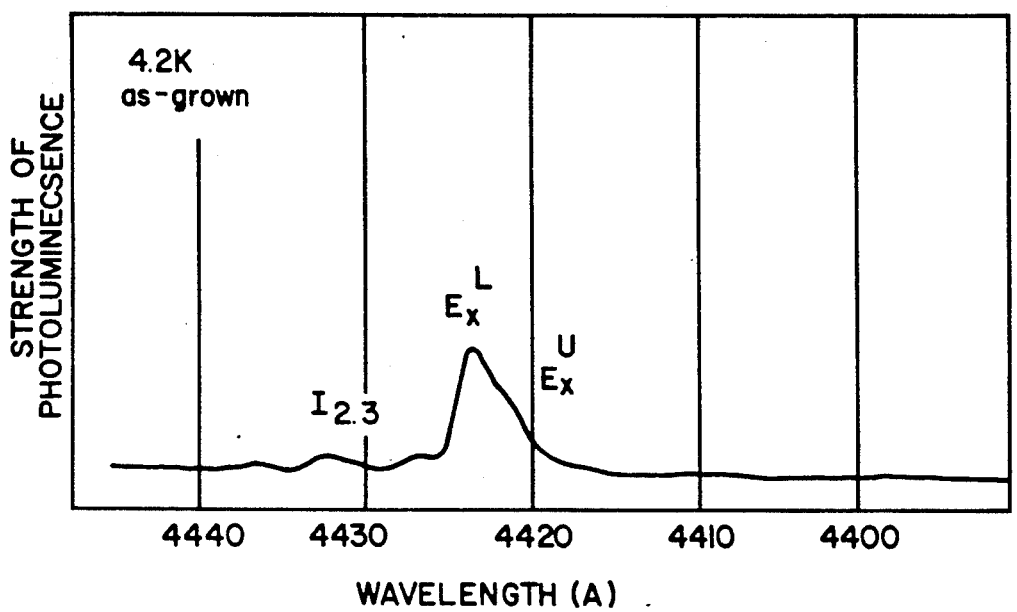
FIG. 3 is a graph showing the result of photoluminescence (4.2 K) of the ZnSe single crystal produced by the RTHM.

The ZnSe single crystal rod was cut out to a square plate having sizes of 7 mm×7 mm×2 mm. The characteristics of the as grown single crystal were analyzed by photoluminescence with using the He-Cd laser as the excitation light source at 4.2 K. The result is shown in FIG. 3. In this figure, $E_x^L$ and $E_x^U$ represent the emission from the free excitons. The free exciton is in the state in which the electron and the positive hole are weakly bonded by the Coulomb's force. "Free" means that the exciton is not constrained with the impurity atom. $I_2$ and $I_3$ represent the emission from the excitons constrained with the impurity atoms. As the amount of the donor impurities increases, the strength of these emissions increases.

From FIG. 3, it is understood that the emission strength of $E_x^L$ and $E_x^U$ is very strong, while that of $I_2$ and $I_3$ is weak. This indicates that the as grown ZnSe single crystal contains less impurity and is highly pure.

Since the ZnSe single crystal used in the present invention is very pure, the subsequent selective doping of the ZnSe single crystal is possible.

EXAMPLE 2

According to the present invention, the ZnSe single crystal substrate was doped with the donor impurities.

As shown in FIG. 1, the dopant (0.5 g), Zn (10.0 g) and the ZnSe single crystal substrate having a size of 7×7×2 mm were charged in the quartz tube. In this case, no inert gas was filled in the tube. Then, the tube was evacuated and sealed.

As the dopant, Al, Cl, Ga or In was used. Al, Ga or In was used in the metal form, while Cl was used as $ZnCl_2$.

Then the quarts tube containing the dopant, ZnSe and Zn was heated at 800° C. for 40 hours.

The ZnSe single crystal doped with the impurity by the thermal diffusion was subjected to photoluminescence by using the He-Cd laser as the excitation light source at 4.2 K.

Figure 4:
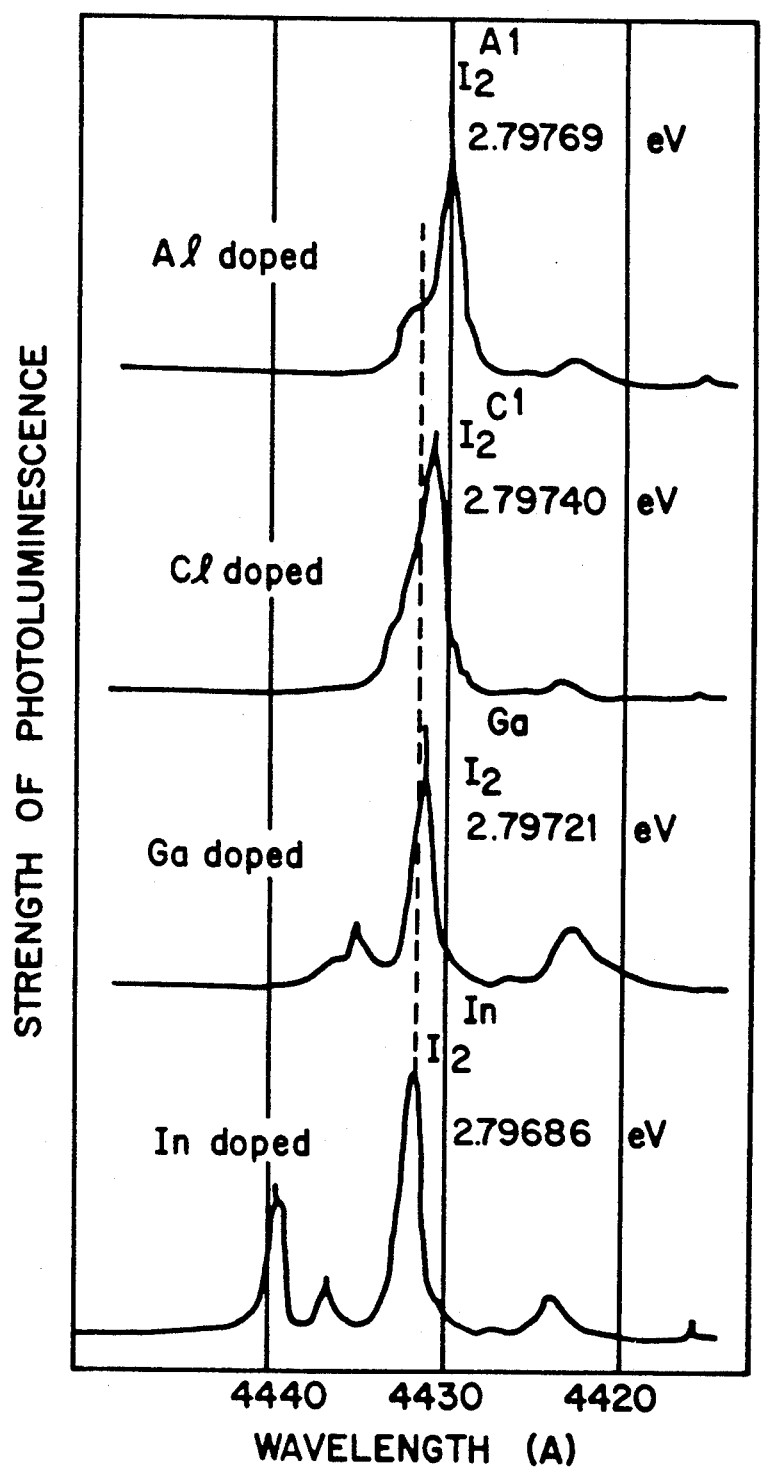
FIG. 4 is a graph showing the results of photoluminescence (4.2 K) of the ZnSe single crystal doped with the n-type impurities Al, Cl, Ga and In, respectively.

The results are shown in FIG. 4. The strong emission peak $I_2$ due to the donor impurity appeared. The energy was 2.79769 eV for Al, 2,79740 eV for Cl, 2,79721 eV for Ga and 2.79686 eV for In. The emission was from the excitons constrained with the donor impurities.

It is to be noted that all the peaks corresponding to the impurities which were not intentionally doped were very weak. This means that the ZnSe single crystal was not contaminated with the impurities other than the intentionally doped ones.

The emission peak due to the free excitons becomes relatively weak. Since the photoluminescence is measured at extremely low temperature of 4.2 K, those having low energy are easily excited. Since the excitons constrained with the donor or acceptor have the smaller energy than the free excitons, possibility that the free excitions are excited decreases as the number of the excitons constrained with the donor impurities increases.

Important is how the electric resistance of the ZnSe single crystal was changed. The as grown ZnSe single crystal has resistivity of $10^8$ to $10^9$ ohm.cm. The ZnSe single crystal substrate which was n-type doped by the method of the present invention has resistivity of $10^2$ to $10^3$ ohm.cm. The single crystal having such low resistivity can be used as the substrate for the LED.

EXAMPLE 3

According to the present invention, sodium as the acceptor impurity was doped.

In the quartz tube, $Na_2Se$ (0.5 g), selenium (10.5 g) and the ZnSe single crystal substrate as produced in Example 1 having a size of 7×7×2 mm were charged. The tube was evacuated and sealed. Then, the tube containing $Na_2Se$, selenium and the ZnSe single crystal substrate was heated at a temperature of 400° C. to 800° C. for 40 hours.

The ZnSe single crystal doped with the impurity by the thermal diffusion was subjected to photoluminescence by using the He-Cd laser as the excitation light source at 4.2 K.

Figure 5:
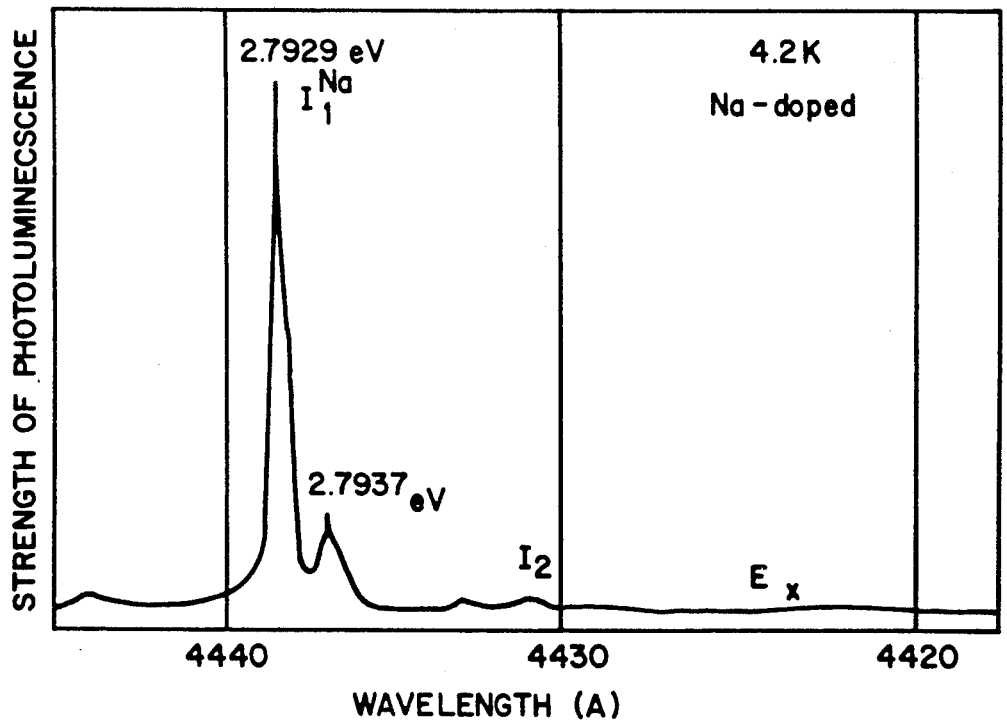
FIG. 5 is a graph showing the result of photoluminescence (4.2 K) of the ZnSe single crystal doped with the p-type impurity Na.

The result is shown in FIG. 5. Two strong peaks are observed at the energy of 2.7929 eV ($I_1^{Na}$) and 2.7937 eV. $I_1$ represents the emission from the excitons constrained with the acceptors. The strong emission at 2.7929 eV means that the sodium atoms are widely spread in the ZnSe single crystal.

Since the emission of 2.7937 eV disappeared when the single crystal was cooled to 2 K, this peak was apparently due to sodium and not due to other impurities.

A weak peak due to the neutral donors was observed near the wavelength of 4,431 Å. Since this peak was very weak, it was confirmed that the contamination with the donor impurities was very little. This is also confirmed from the results of FIG. 3.

According to the method of the present invention, the kind of the doping impurity can be freely selected since the highly pure ZnSe single crystal is used as the substrate to be doped. Further, the impurity concentration to be doped can be controlled by selecting the doping temperature, the impurity concentration, vapor pressure and the doping time.

Since the impurity is doped through the thermal equilibrium doping in the present invention, the impurity can be doped at the desired doping concentration to achieve the desired carrier concentration or the resistivity, with good reproducibility.

No such a large equipment as used in the ion is required to carry out the method of the present invention.

Since the annealing is necessary to restore the lattice structure in the ion implantation method, the impurities tend to move during annealing. This leads to bad reproducibility of the doping by the ion implantation in case of ZnSe. However, according to the present invention, the ZnSe single crystal can be doped with good reproducibility.

What is claimed is:

1. A method for forming a doped ZnSe single crystal, the method comprising the steps of:
    placing a piece of a ZnSe polycrystal in a sealed reactor tube having an atmosphere of at least one gas selected from the group consisting of an inert gas, nitrogen and $H_2Se$ kept at a pressure of from 0.1 Torr to 100 Torr;
    moving the reactor tube containing the piece of ZnSe polycrystal through a low temperature first zone kept at a temperature of from room temperature to 100° C., a temperature-raising second zone having a temperature gradient of from 50° C./cm to 200° C./cm, a high temperature third zone kept at a temperature of from 700°–900° C., a temperature-lowering fourth zone having a temperature gradient of from −200° C./cm to −50° C./cm and a low temperature fifth zone kept at a temperature of from room temperature to 100° C. in this order at a moving rate of from 0.05 mm/day to 5 mm/day while keeping the solid state of the ZnSe crystal whereby the ZnSe polycrystal is converted to a ZnSe single crystal:
    cutting the ZnSe single crystal of form one of a ZnSe single crystal chip and wafer;
    placing the one of the ZnSe single crystal chip and wafer in a reactor containing a member selected from the group consisting of zinc in combination with an n-type impurity, a compound comprising an n-type impurity with zinc, selenium and a p-type impurity and a compound comprising a p-type impurity and selenium;

and heating the reactor at a temperature of 400° C.–900° C. under a pressure of one Torr to 100 Torr for at least 20 hours to diffuse the impurity atoms in the ZnSe single crystal.

* * * * *